US012721148B2

(12) United States Patent
Clevenger et al.

(10) Patent No.: US 12,721,148 B2
(45) Date of Patent: Aug. 25, 2026

(54) SEMICONDUCTOR DEVICE WITH POWER SUPPLY DISTRIBUTION NETWORKS ON FRONTSIDE AND BACKSIDE OF A CIRCUIT

(71) Applicant: International Business Machines Corporation, Armonk, NY (US)

(72) Inventors: Lawrence A. Clevenger, Saratoga Springs, NY (US); Albert M. Chu, Nashua, NH (US); Nicholas Anthony Lanzillo, Wynantskill, NY (US); Brent A. Anderson, Jericho, VT (US); Reinaldo Vega, Mahopac, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 797 days.

(21) Appl. No.: 18/068,123

(22) Filed: Dec. 19, 2022

(65) Prior Publication Data

US 2024/0203880 A1 Jun. 20, 2024

(51) Int. Cl.
*H10W 20/41* (2026.01)
*H10W 20/20* (2026.01)
(Continued)

(52) U.S. Cl.
CPC ......... *H10W 20/427* (2026.01); *H10W 20/20* (2026.01); *H10W 20/40* (2026.01);
(Continued)

(58) Field of Classification Search
CPC . H01L 23/5286; H01L 23/481; H01L 23/485; H01L 23/49827; H01L 23/50;
(Continued)

(56) References Cited

U.S. PATENT DOCUMENTS 10,636,739 B2 4/2020 Beyne et al.
11,270,991 B1 3/2022 Chava et al.
(Continued)

FOREIGN PATENT DOCUMENTS

WO 2022119651 A1 6/2022

OTHER PUBLICATIONS

Chen, et al., "Design and Optimization of SRAM Macro and Logic Using Backside Interconnects at 2nm Node," Published in: 2021 IEEE International Electron Devices Meeting (IEDM), Date of Conference: Dec. 11-16, 2021, San Francisco, CA, USA, DOI: 10.1109/IEDM19574.2021.9720528.

*Primary Examiner* — Dale E Page
*Assistant Examiner* — Cristian A Tivarus
(74) *Attorney, Agent, or Firm* — Amin, Turocy & Watson, LLP

(57) ABSTRACT

One or more systems, devices, and/or methods of use provided herein relate to a semiconductor device with separate power supplies for front side and backside stacked power distribution. A semiconductor device can include one or more circuits, a first power supply, a second power supply, and a third power supply. The first power supply can be disposed on a first side of the one or more circuits. The second power supply can be disposed on the first side of the one or more circuits. Further, the third power supply can be disposed on a second side of the one or more circuits. Additionally, the first side of the one or more circuits can be opposite to the second side of the one or more circuits.

17 Claims, 12 Drawing Sheets

(51) Int. Cl.
*H10W 20/40* (2026.01)
*H10W 70/63* (2026.01)
*H10W 72/00* (2026.01)
*H10W 90/00* (2026.01)

(52) U.S. Cl.
CPC ......... *H10W 70/635* (2026.01); *H10W 72/00* (2026.01); *H10W 90/00* (2026.01)

(58) Field of Classification Search
CPC ............ H01L 25/0655; H10W 20/427; H10W 20/20; H10W 20/40; H10W 70/635; H10W 72/00
See application file for complete search history.

(56) References Cited

U.S. PATENT DOCUMENTS

| | | | |
|---|---|---|---|
| 11,380,384 | B2 | 7/2022 | Chen et al. |
| 2020/0266169 | A1 | 8/2020 | Kang et al. |
| 2020/0373242 | A1 | 11/2020 | Hiblot et al. |
| 2021/0336001 | A1 | 10/2021 | Yang et al. |
| 2022/0068813 | A1 | 3/2022 | Chen et al. |
| 2022/0123751 | A1 | 4/2022 | Thyagarajan et al. |
| 2022/0130760 | A1* | 4/2022 | Wu ...................... H10D 84/038 |
| 2022/0188496 | A1 | 6/2022 | Edathil et al. |
| 2022/0208757 | A1* | 6/2022 | Do ......................... H10D 89/10 |
| 2023/0260965 | A1* | 8/2023 | Li ........................... H01L 25/16 257/668 |

* cited by examiner

SEMICONDUCTOR DEVICE WITH POWER SUPPLY DISTRIBUTION NETWORKS ON FRONTSIDE AND BACKSIDE OF A CIRCUIT

BACKGROUND

One or more embodiments described herein relate generally to optimizing semiconductor devices with respect to the various connected components. Embodiments relate to connecting power supplies to both the frontside and backside of a circuit, and more specifically, to systems and methods to facilitate semiconductor devices having voltage domains on both sides of the circuit without voltage supply blockage.

SUMMARY

The following presents a summary to provide a basic understanding of one or more embodiments described herein. This summary is not intended to identify key or critical elements or delineate any scope of the particular embodiments or any scope of the claims. The sole purpose of the summary is to present concepts in a simplified form as a prelude to the more detailed description that is presented later. In one or more embodiments described herein, systems, devices, and/or methods, that facilitate semiconductor devices with power supply distribution networks on frontside and backside of a circuit without voltage supply layout blockage are described.

According to an embodiment, a semiconductor device can comprise one or more circuits, and a first power supply disposed on a first side of the one or more circuits. The semiconductor device can include a second power supply that can be disposed on the first side of the one or more circuits. The semiconductor device can include a third power supply that can be disposed on a second side of the circuit. Additionally, the first side of the circuit can be opposite to the second side of the circuit. The one or more circuits can receive power from the first power supply, the second power supply, and the third power supply within the same circuit row.

According to another embodiment, a semiconductor device can comprise one or more circuits coupled to a frontside power distribution network and a backside power distribution network. The semiconductor device can include one or more connecting vias that can be disposed between the frontside power distribution network and the backside power distribution network that can couple the frontside power distribution network with the backside power distribution network. Additionally, the backside power distribution network can include a first power supply, a second power supply, and a first portion of a third power supply. The frontside power distribution network can include a second portion of the third power supply coupled to the first portion of the third power supply by at least one of the one or more connecting vias. Further, the one or more circuits can receive power from the first power supply, the second power supply, and the third power supply within the same circuit row.

According to yet another embodiment, a semiconductor device can comprise one or more circuits coupled to a frontside power distribution network and a backside power distribution network. The semiconductor device can also include one or more connecting vias that can be disposed between the frontside power distribution network and the backside power distribution network that can couple the frontside power distribution network with the backside power distribution network. The backside power distribution network can include a first power supply, a second power supply having a first portion and a second portion. The frontside power distribution network can include a third power supply. The first portion of the second power supply can be coupled to the one or more circuits. Further, the second portion of the first power supply can provide power to the third power supply on the frontside power distribution network. The one or more circuits can receive power from the first power supply, the second power supply, and the third power supply within the same circuit row.

DETAILED DESCRIPTION

Figure 1:
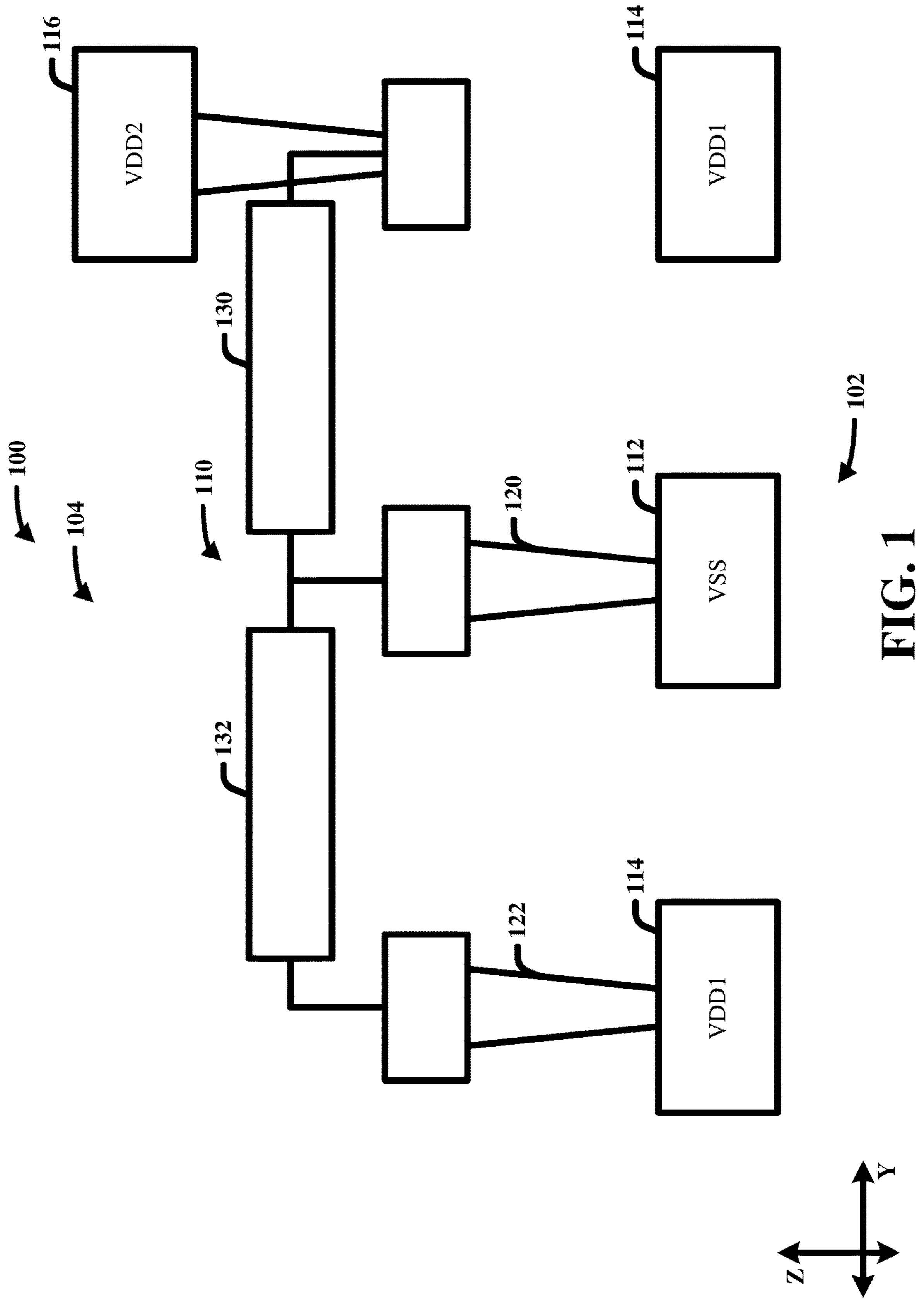
FIG. 1 illustrates a cross-sectional view of an example, non-limiting semiconductor device comprising frontside and backside power distribution networks, in accordance with one or more embodiments described herein.

The following detailed description is merely illustrative and is not intended to limit embodiments or application or uses of embodiments. Furthermore, there is no intention to be bound by any expressed or implied information presented in the preceding Background or Summary sections, or in this Detailed Description section.

Discussion is provided herein relative to configuration, including fabrication, of an electronic structure that can comprise and/or be comprised by a controller, payload and/or other chip-based structure. In one or more embodiments, the electronic structure can be configured for use in a quantum system. However, as there are many uses for devices comprising silicon chips, the discussion herein need not apply solely to quantum computer electronics, but can also apply to many other control, radio, radar, cryogenic and/or signal-based applications, among others. Description and discussion herein is therefore not limited to use in a quantum computing system.

In some cases, it can be desirable to optimize conductive lines and/or vias of a semiconductor to cause optimal performance of coupled devices (e.g., inverters, transistors, etc.). One or more various devices and/or circuits can be coupled to the semiconductor device, and the one or more various devices and/or circuits can utilize different connection configurations with the conductive lines and/or vias to perform optimally (e.g., at various voltages). Further, it can be desirable to supply power to the various devices and/or circuits from a frontside of the semiconductor device (e.g., a frontside power distribution network). With embodiments, the frontside of the semiconductor device can provide power for memory control logic disposed on a top of the semiconductor device.

It can also be desirable to supply power to the various devices and/or circuits from a backside of the semiconductor device (e.g., a backside power distribution network). Supplying power to the one or more various devices and/or circuits from both a frontside and a backside of the semiconductor device can improve the efficiency of components distributed on and/or coupled to the semiconductor device. For example, and without limitation, such efficient structure can facilitate additional area for signal wiring to be disposed on the front side of the semiconductor device due to the multiple voltage domains provided across the same circuit row. The backside of the semiconductor device can be responsible for providing core voltages to the components connected with the semiconductor device. In embodiments, components connected with the semiconductor device can access a variety of voltage sources within the same circuit row.

Additionally, the resulting profile of the backside power distribution can be a repeatable pattern of ground sources and voltage sources. Such a repeating profile on the backside of the non-limiting semiconductor device can facilitate a more efficiently distributed power distribution network (e.g., and in some cases additional space for signal wiring to be disposed). The non-limiting semiconductor device can support a common set of standard circuit cells (e.g., one or more various circuit configurations for operating I/O devices, IP cores, logic cores, IP Blocks, IP Cells, and/or other IP and/or I/O circuitry). Further, the standard cells can be used for both frontside power distribution and backside power distribution; and can be coupled to the semiconductor device with one or more of a plurality of voltage sources and ground sources.

Additional description of functionalities will be further described below with reference to the example embodiments of FIG. 1, where repetitive description of like elements and/or processes employed in respective embodiments is omitted for sake of brevity. The non-limiting semiconductor device can comprise one or more circuits, a first power supply, a second power supply, and a third power supply. The first power supply can be disposed on a first side of the one or more circuits (e.g., the backside). Additionally, the second power supply can be disposed on the first side of the one or more circuits. The third power supply can be disposed on a second side of the one or more circuits. Further, the first side of the one or more circuits can be opposite to the second side of the one or more circuits (e.g., in the Z-direction). With examples, the first power supply can be a ground source. The second power supply and the third power supply can supply power from the backside of the one or more circuits, and the third power supply can supply power from the frontside of the one or more circuits. The second power supply and the third power supply can include one or more of a variety of voltage ranges. For example, and without limitation, voltages of each of the second power supply and the third power supply can range from about 1.2V to about 3.3V.

In embodiments, FIG. 1 illustrates a cross-sectional view of an example, non-limiting semiconductor device 100 that can address the challenges of power optimization for circuits and devices coupled to both frontside and backside voltages. The cross-sectional view of FIG. 1 can be seen as taken along the Y plane of FIG. 2. Turning back to FIG. 1, the semiconductor device 100 can include a first side 102 and a second side 104. The first side 102 can be a backside of the semiconductor device 100, and the second side 104 can be a frontside of the semiconductor device 100. Further, as seen in FIG. 1, the first side 102 can be disposed opposite the second side 104 (e.g., vertically, in the Z-direction).

With embodiments, the non-limiting semiconductor device 100 can include one or more circuits 110, a first power supply 112, a second power supply 114, and a third power supply 116. The first power supply 112 can be disposed on the first side 102 of the one or more circuits 110, and, additionally, the second power supply 114 can be disposed on the first side 102 of the one or more circuits 110. The third power supply 116 can be disposed on the second side 104 of the one or more circuits 110. Further, the third power supply 116 can be disposed opposite the first power supply 112 and the second power supply 114 (e.g., in the Z-direction).

In embodiments, the one or more circuits 110 can be coupled with the first power supply 112 and the second power supply 114 with one or more of a variety of via connection formations. For example, and without limitation, the semiconductor device 100 can include a first via connection formation 120 and a second via connection formation 122. The first via connection formation 120 can be disposed vertically between (e.g., in the Z-direction) the first power supply 112 and the circuit 110. The second via connection formation 122 can be disposed vertically between (e.g., in the Z-direction) the second power supply 114 and the one or more circuits 110.

With embodiments, the one or more circuits 110 can include a plurality of circuits (e.g., a plurality of standard circuit cells as referenced above) including a first circuit 130 and a second circuit 132. The first circuit 130 can be electrically coupled to the first power supply 112 by the first via connection formation 120. Similarly, the second circuit 132 can be electrically coupled to the second power supply 114 by the second via connection formation 122. The third power supply 116 can be generated by the first circuit 130 and the second circuit 132 (e.g., indirectly coupled with the first power supply 112 and the second power supply 114). Further, the second power supply 114 and the third power supply 116 can utilize the first power supply 112 as a grounding source for the first circuit 130 and the second circuit 132.

Figure 2:
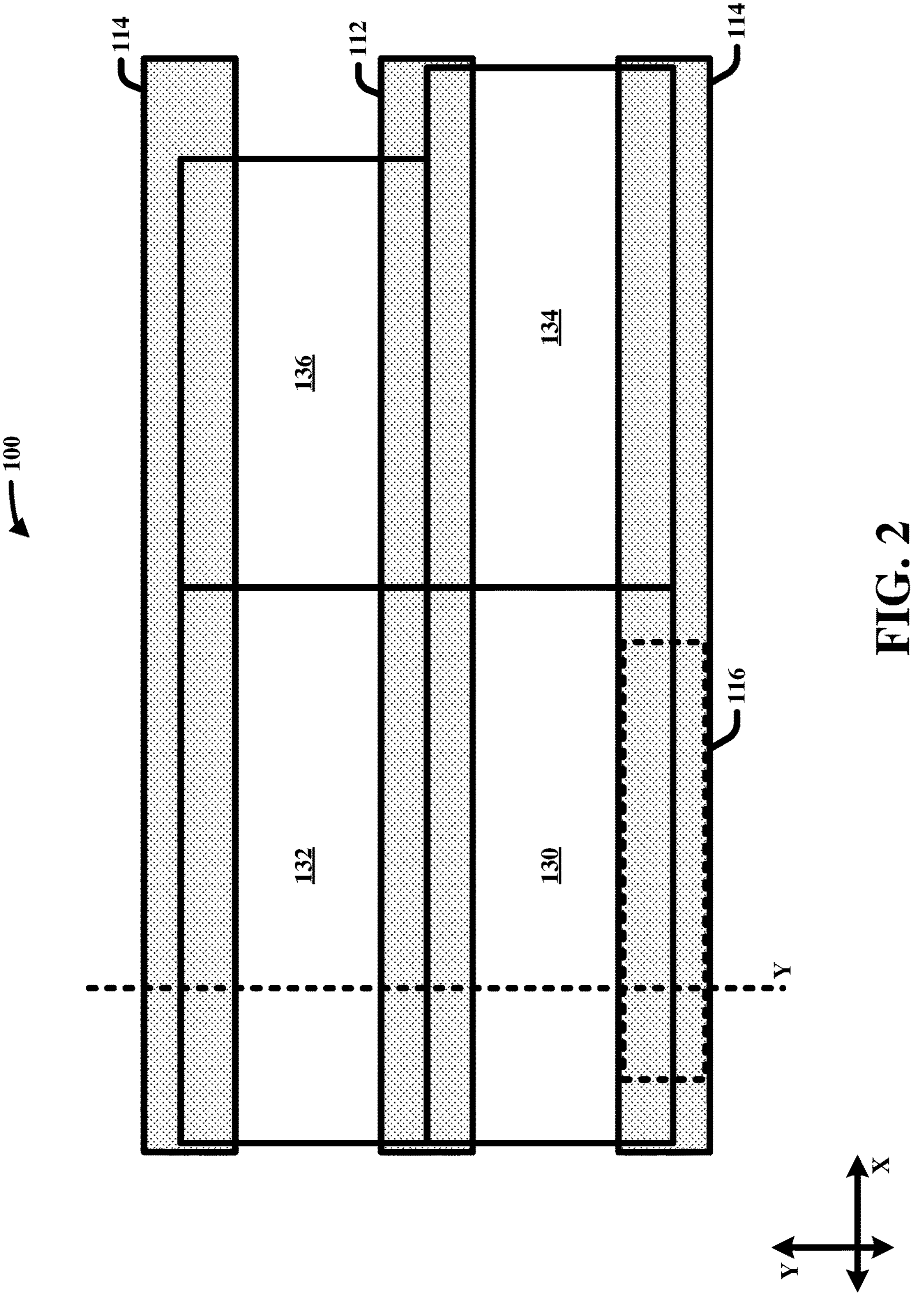
FIG. 2 illustrates a top-cross-sectional view of an example, non-limiting semiconductor device comprising frontside and backside power distribution networks, in accordance with one or more embodiments described herein.

In embodiments, such as generally illustrated in FIG. 2 (e.g., a top-down view from the backside of the one or more circuits 110), the third power supply 116 can be the voltage domain available to the one or more circuits 110 on the frontside, and the second power supply 114 can be the voltage domain available to the one or more circuits 110 on the backside. The second power supply 114 and the third power supply 116 can be coupled with the first power supply 112 (e.g., a ground source/connection).

With examples, the non-limiting semiconductor device 100 can include a third circuit 134 and a fourth circuit 136. The third circuit 134 and the fourth circuit 136 can be coupled to the first power supply 112 and the second power supply 114. The third circuit 134 and the fourth circuit 136 can be disposed adjacent to the first circuit 130 and the second circuit 132, respectively (e.g., in the X-direction). For example, and without limitation, the third circuit 134 and the fourth circuit 136 can be offset/misaligned (e.g., in the X-direction) such as to not contact the third power supply 116. The first circuit 130, the second circuit 132, the third circuit 134, and the fourth circuit 136 can access a variety of voltages from coupled sources to the semiconductor device 100 on the frontside and the backside (e.g., to be supplied to components coupled with the semiconductor device 100).

Figure 3:
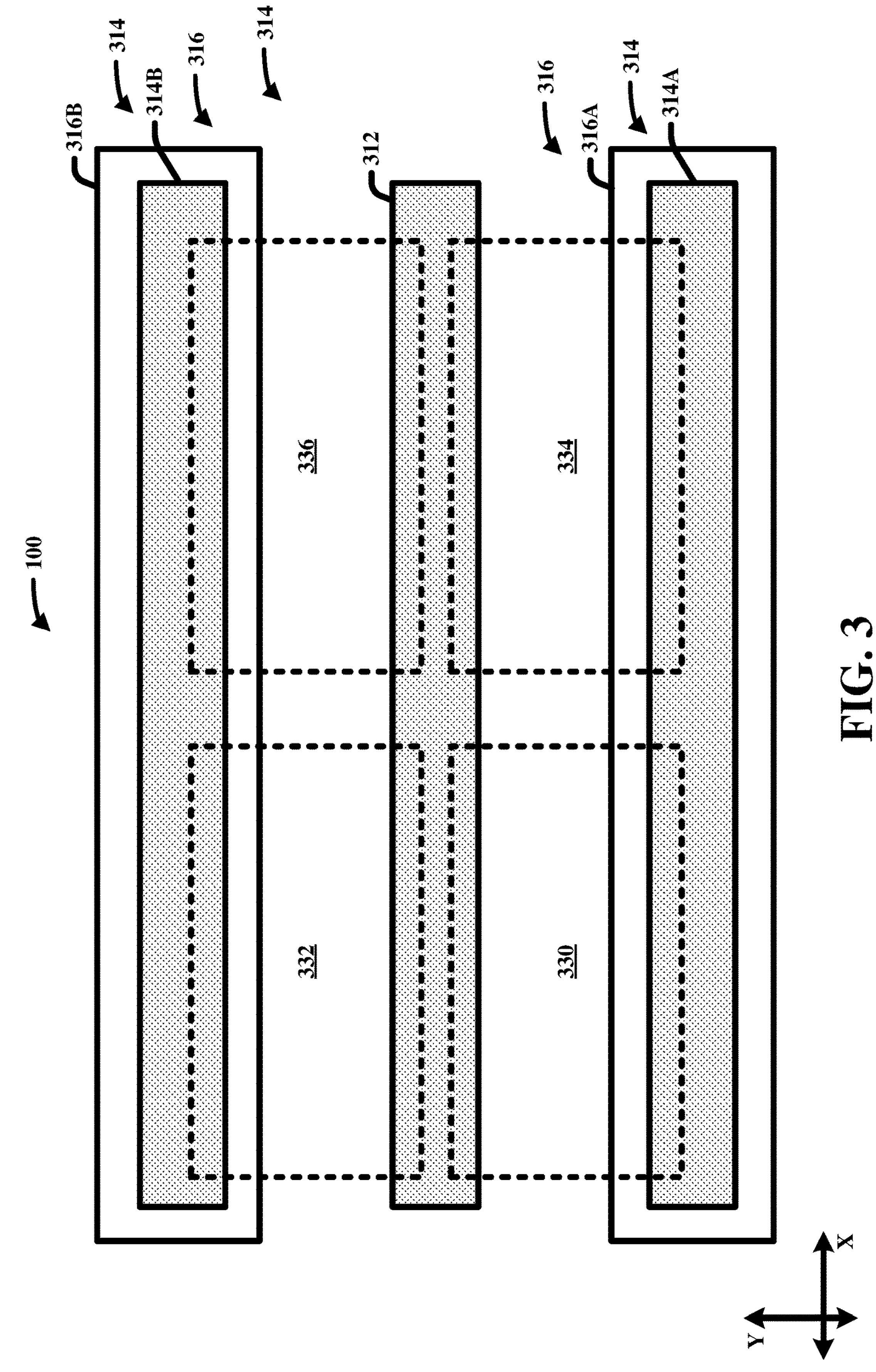
FIG. 3 illustrates a top-cross-sectional view of an example, non-limiting semiconductor device comprising frontside and backside power distribution networks as continuous rails, in accordance with one or more embodiments described herein.

In embodiments, such as generally shown in FIG. 3, the first power supply 312, the second power supply 314, and the third power supply 316 can be substantially parallel rails (e.g., continuous rails in the X-direction). The third power supply 316 can comprise two parallel rails (a first rail 316A, and a second rail 316B) with the first power supply 312 disposed between (e.g., in the Y-direction) which can be single rail. The second power supply 314 can comprise two parallel rails (a first rail 314A, and a second rail 314B). The first circuit 330 and the third circuit 334 of the semiconductor device 100 can be coupled to the first power supply 312, the first rail 314A of the second power supply 314, and the first rail 316A of the third power supply 316. Additionally, the second circuit 332 and the fourth circuit 336 can be coupled to the first power supply 312, the second rail 314B of the second power supply 314, and the second rail 316B of the third power supply 316.

Figure 4:
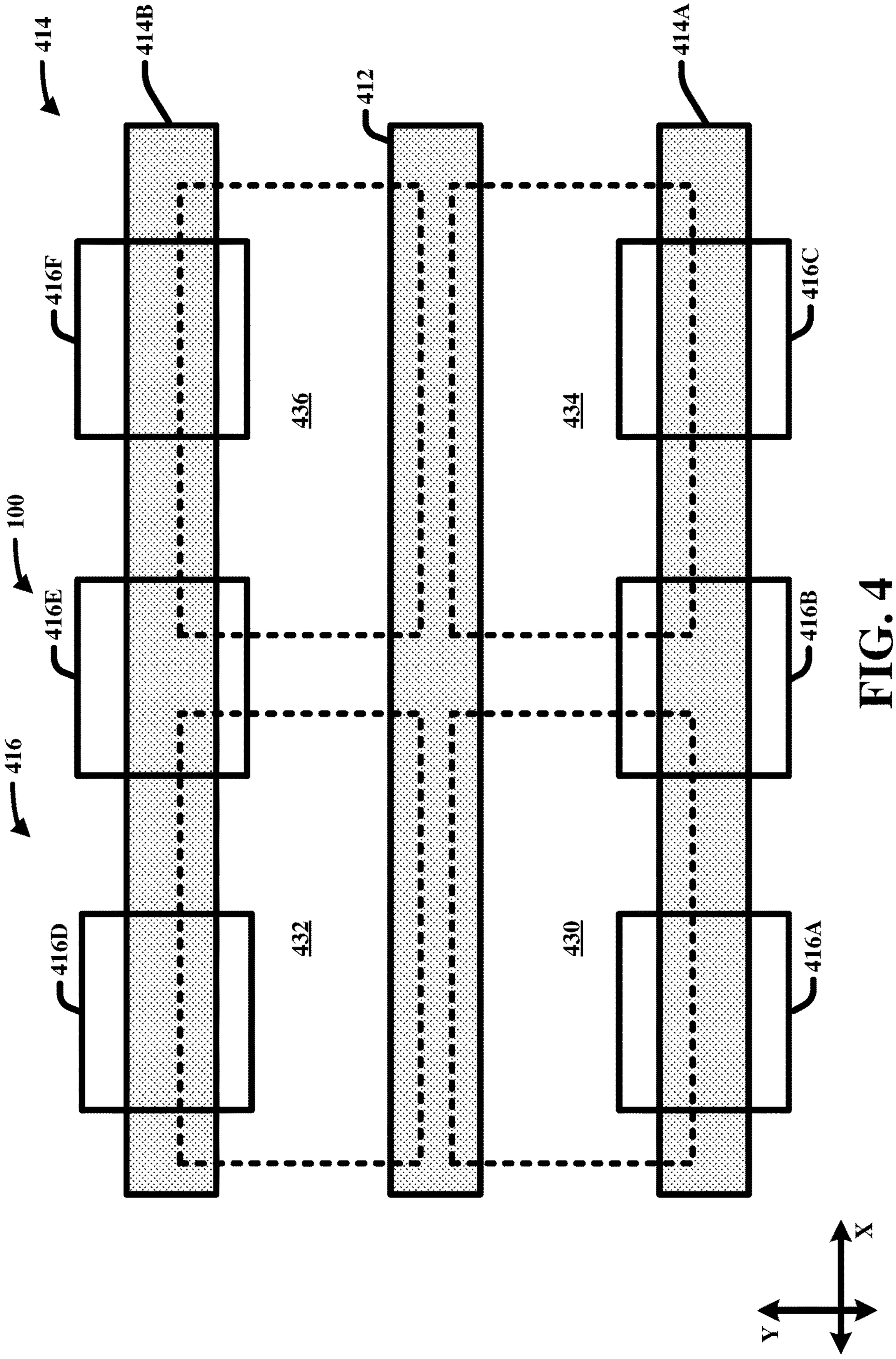
FIG. 4 illustrates a top-cross-sectional view of an example, non-limiting semiconductor device comprising frontside and backside power distribution networks as rail segments, in accordance with one or more embodiments described herein.

With embodiments, such as generally shown in FIG. 4, the non-limiting semiconductor device 100 can include the third power supply 416 formed as one or more of a variety of rail segments (e.g., staples, portions, etc.). The third power supply 416 can be formed as a first segment 416A, a second segment 416B, a third segment 416C, a fourth segment 416D, a fifth segment 416E, and a sixth segment 416F. The first segment 416A, the second segment 416B, and the third segment 416C can be coupled to the first rail 414A of the second power supply 414. The fourth segment 416D, the fifth segment 416E, and the sixth segment 416F can be coupled to the second rail 414B of the second power supply 414. Further, the first power supply 412 can be coupled to the first circuit 430, the second circuit 432, the third circuit 434, and the fourth circuit 436. The first circuit 430 can be coupled to the first rail 414A of the second power supply 414, the first segment 416A and the second segment 416B of the third power supply, and the first power supply 412. Additionally, the second circuit 432 can be coupled to the first power supply 412, the second rail 414B of the second power supply, the fourth segment 416D and the fifth segment 416E of the third power supply 416.

For example, and without limitation, in additional embodiments, the third circuit 434 can be coupled with the first power supply 412, the first rail 414A of the second power supply 414, and the second segment 416B and the third segment 416C of the third power supply 416. The fourth circuit 436 can be coupled to the first power supply 412, the second rail 414B of the second power supply 414, and the fifth segment 416E and the sixth segment 416F of the third power supply 416.

Figure 5:
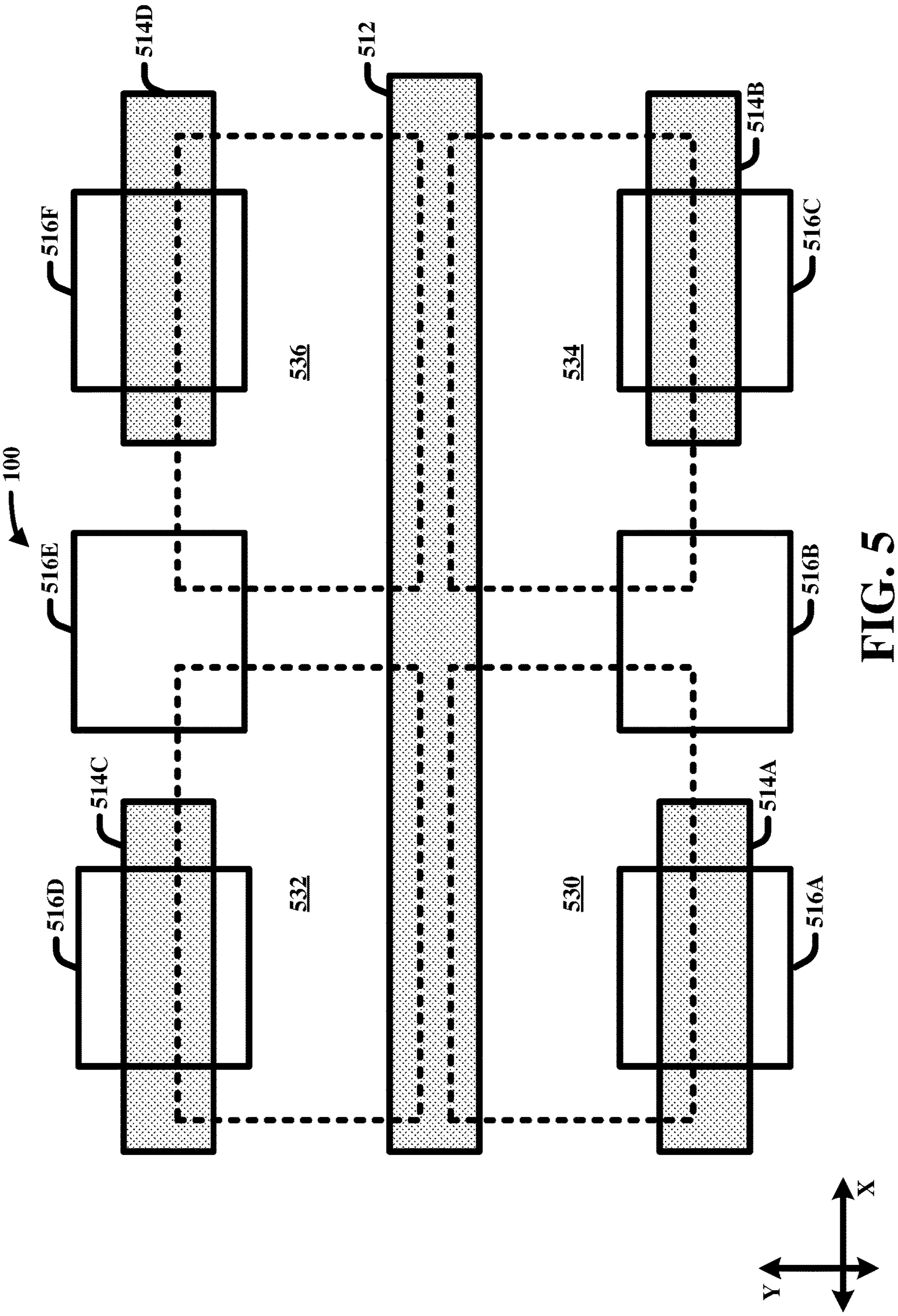
FIG. 5 illustrates a top-cross-sectional view of an example, non-limiting semiconductor device comprising frontside and backside power distribution networks as rail segments, in accordance with one or more embodiments described herein.

In embodiments, such as generally shown in FIG. 5, the non-limiting semiconductor device 100 can include the second power supply 514 and the third power supply 516 formed as one or more of a variety of rail segments (e.g., staples, portions, etc.). The second power supply 514 can be formed as a first segment 514A, a second segment 514B, a third segment 514C, and a fourth segment 514D. The first segment 514A and the second segment 514B can be aligned substantially parallel in the X-direction. Additionally, the third segment 514C and the fourth segment 514D can be aligned substantially parallel in the X-direction. The third power supply 516 can be formed as a first segment 516A, a second segment 516B, a third segment 516C, a fourth segment 516D, a fifth segment 516E, and a sixth segment 516F. The first segment 516A, the second segment 516B, and the third segment 516C can be aligned substantially parallel in the X-direction. The fourth segment 516D, the fifth segment 516E, and the sixth segment 516F can be aligned substantially parallel in the X-direction. The first segment 514A of the second power supply 514 can be coupled to the first segment 516A of the third power supply 516. Additionally, the third segment 516C of the third power supply 516 can be coupled to the second segment 514B of the second power supply 514. The third segment 514C of the second power supply 514 can be coupled to the fourth segment 516D of the third power supply 516. Similarly, the fourth segment 514D of the second power supply 514 can be coupled to the sixth segment 516F of the third power supply 516.

With embodiments, the second segment 516B of the third power supply 516 can be coupled to the first circuit 530 and the third circuit 534. The fifth segment 516E of the third power supply 516 can be coupled to the second circuit 532 and the fourth circuit 536. Further, the power supply 512 can be coupled to the first circuit 530, the second circuit 532, the third circuit 534, and the fourth circuit 536.

Figure 6:
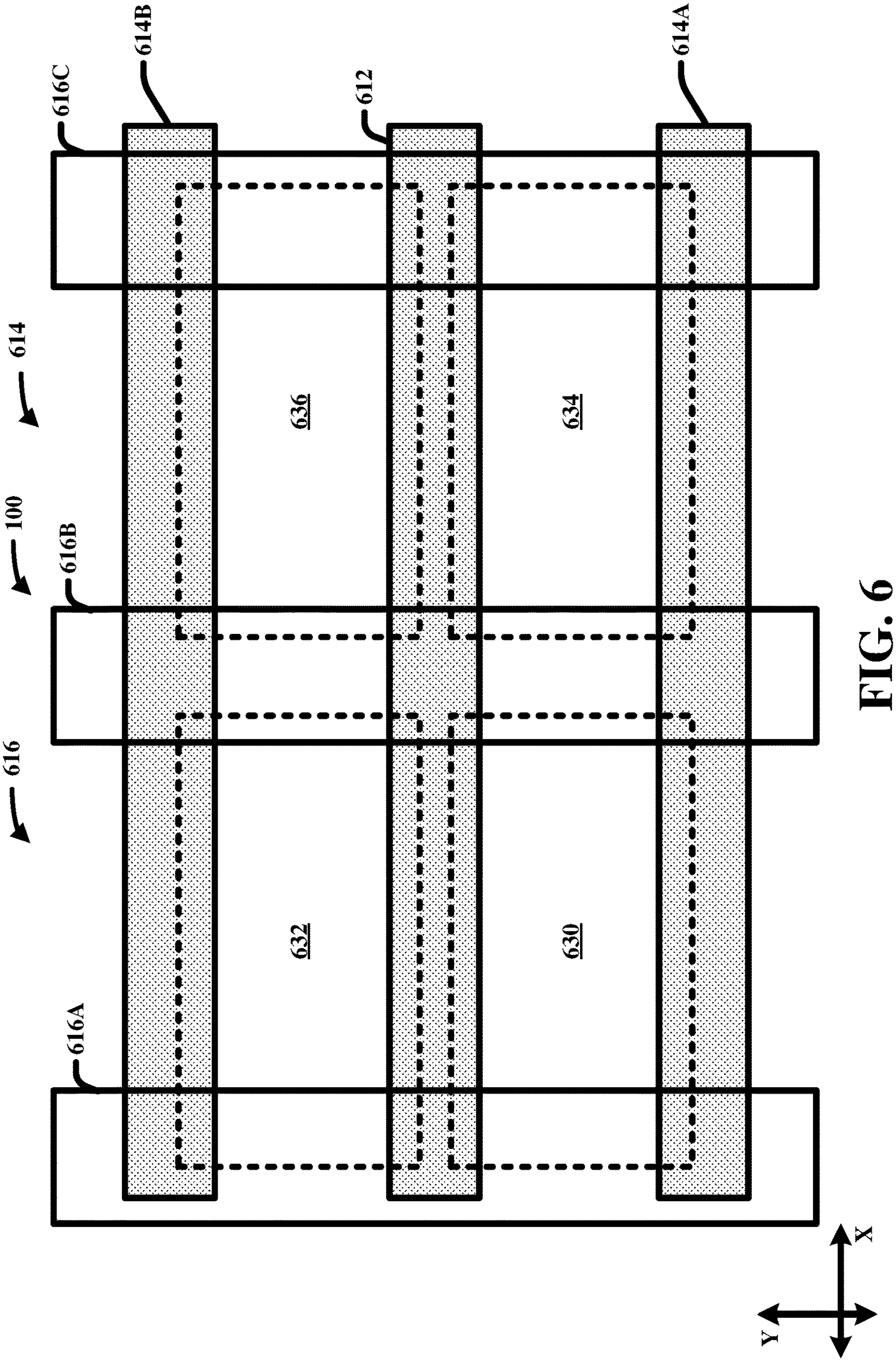
FIG. 6 illustrates a top-cross-sectional view of an example, non-limiting semiconductor device comprising frontside and backside power distribution networks as perpendicular rails, in accordance with one or more embodiments described herein.

In embodiments, such as generally illustrated in FIG. 6, the non-limiting semiconductor device 100 can include the third power supply 616 disposed substantially perpendicular to (e.g., in the X-Y plane) the first power supply 612 and the second power supply 614. The second power supply 614 can be formed as a plurality of rails. The plurality of rails can include a first rail 614A and a second rail 614B. Additionally, the third power supply 616 can include a plurality of rails, which can include a first rail 616A, a second rail 616B, and a third rail 616C. The plurality of rails that comprise the second power supply 614 can be disposed in a substantially parallel manner with respect to each other. Similarly, the plurality of rails that comprise the third power supply 616 can be disposed in a substantially parallel manner with respect to each other. The first power supply 612 can be disposed between (e.g., in the Y-direction) between the first rail 614A and the second rail 614B.

With embodiments, the first circuit 630 can be in contact with the first power supply 612, the first rail 614A of the second power supply 614, and the first rail 616A and the second rail 616B of the third power supply 616. The second circuit 632 can be in contact with the first power supply 612, the first rail 614A of the second power supply 614, and the first rail 616A and the second rail 616B of the third power supply 616. The third circuit 634 can be in contact with the first power supply 612, the first rail 614A of the second power supply, and the second rail 616B and the third rail 616C of the third power supply 616. The fourth circuit 636 can be in contact with the first power supply 612, the second rail 614B of the second power supply 614, and the second rail 616B and the third rail 616C of the third power supply 616.

Figure 7:
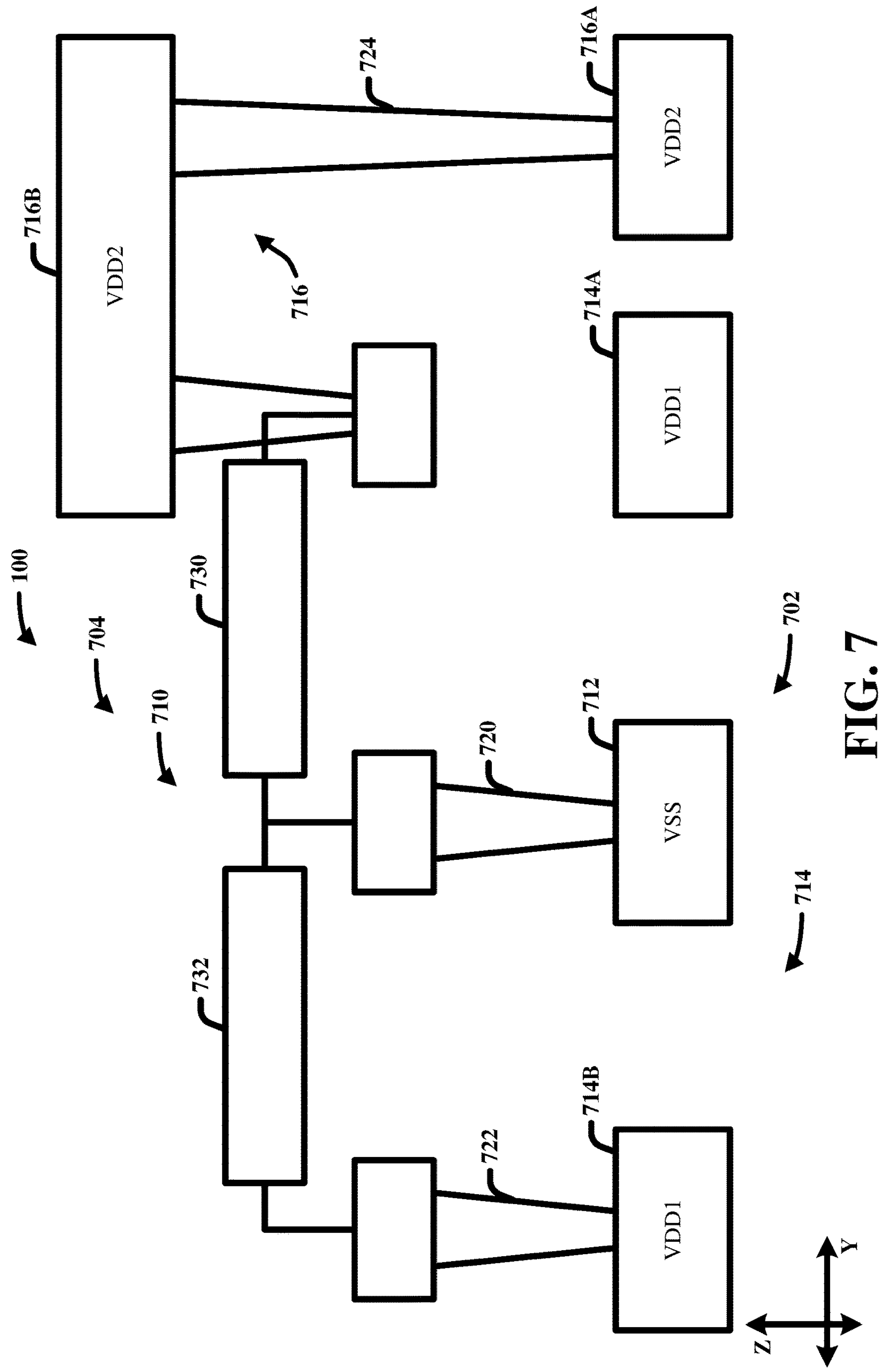
FIG. 7 illustrates a cross-sectional view of an example, non-limiting semiconductor device comprising frontside and backside power distribution networks, in accordance with one or more embodiments described herein.

In embodiments, such as generally illustrated in FIG. 7, the non-limiting semiconductor device 100 can include drawing power from the backside 702 of the circuit 710 from the third power supply 716 with a third via connection formation 724 to connect the third power supply 716 to the frontside 704 of the circuit 710 (e.g., such that the third power supply 716 can be accessed from the backside 702 and the frontside 704). The second power supply 714 can include a first portion 714A and a second portion 714B (e.g., disposed on the backside 702). The third power supply 716 can include a first portion 716A disposed on the backside 702 and a second portion 716B disposed on the frontside 704. The first portion 716A can be coupled to the second portion 716B with the via connection formation 724 that can extend vertically (e.g., in the Z-direction) between the first portion 716A and the second portion 716B.

Figure 8:
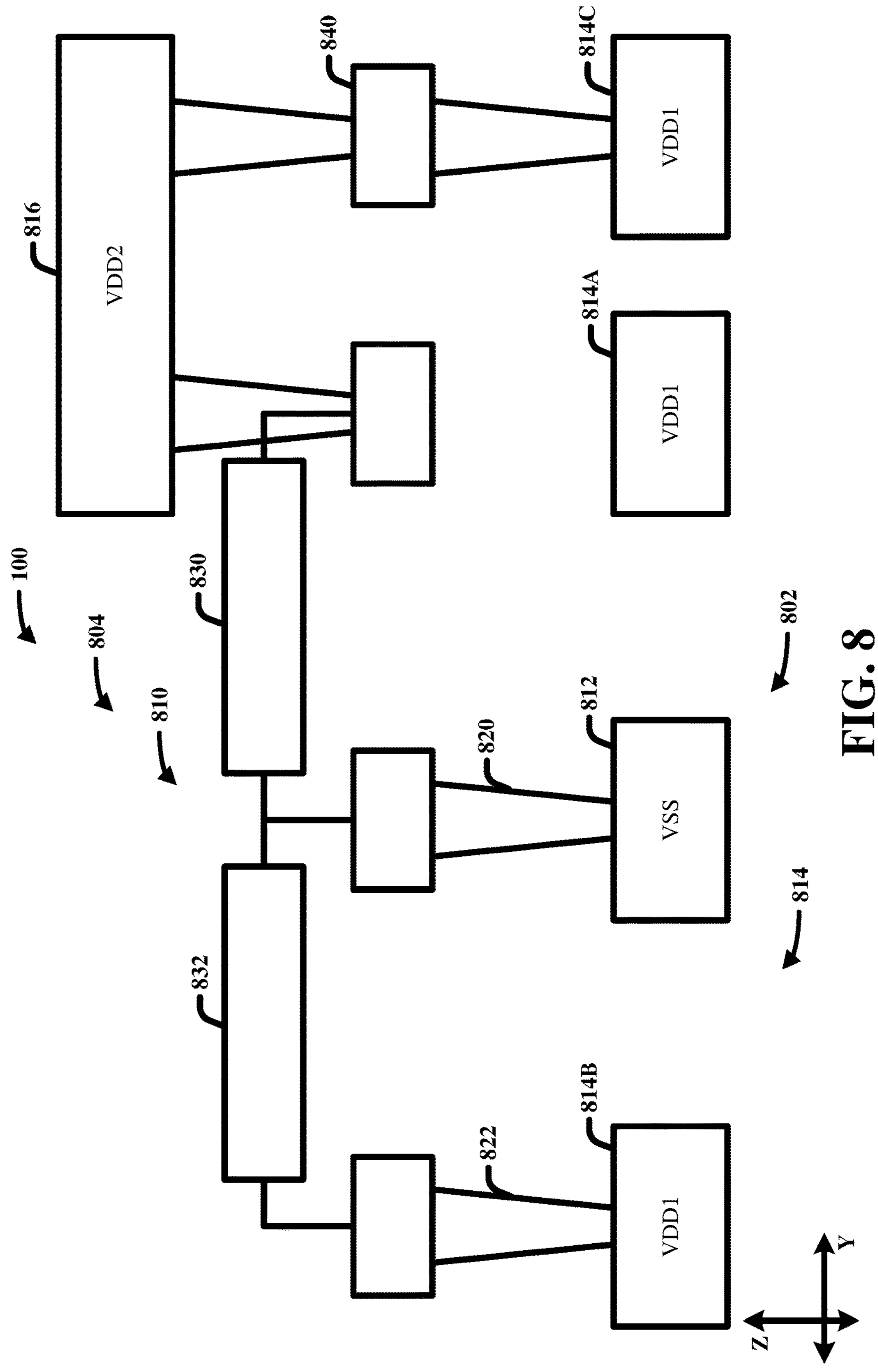
FIG. 8 illustrates a cross-sectional view of an example, non-limiting semiconductor device comprising frontside and backside power distribution networks, in accordance with one or more embodiments described herein.

With embodiments, such as generally illustrated in FIG. 8, the non-limiting semiconductor device 100 can include a voltage regulation circuit 840 to manage the voltage of the third power supply 816 (e.g., to change the voltage to a user desired level within a range generally of about 1.2V to about 3.3V). The second power supply 814 can include a first portion 814A, a second portion 814B, and a third portion 814C. The third portion 814C can be coupled with the voltage regulation circuit 840 to generate a greater or lesser voltage than the second power supply 814 as the voltage of the third power supply 816. Further, the voltage regulation circuit 840 can be coupled vertically (e.g., in the Z-direction) between the third portion 814C of the second power supply 814 and the third power supply 816.

Figure 9:
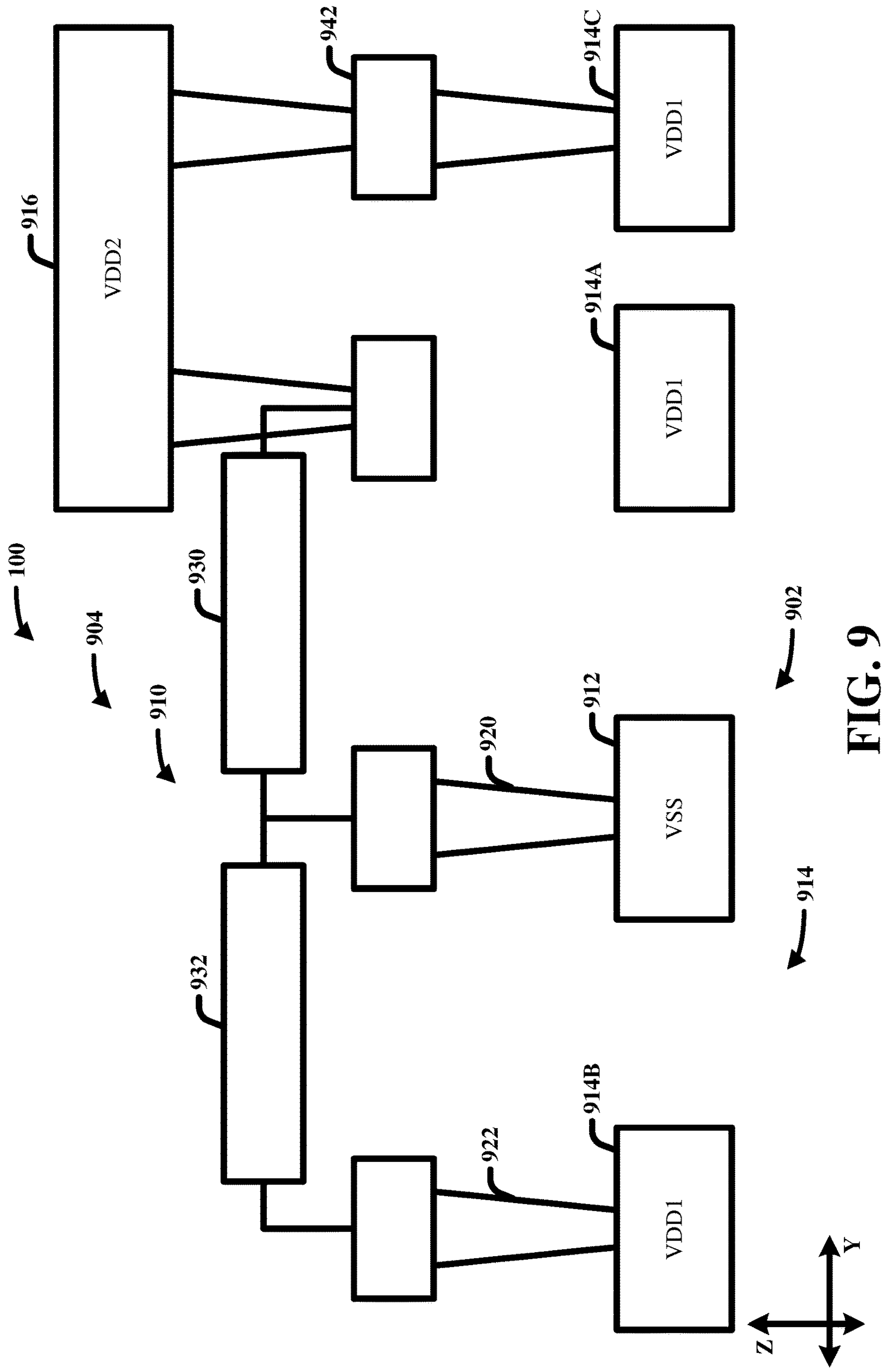
FIG. 9 illustrates a cross-sectional view of an example, non-limiting semiconductor device comprising frontside and backside power distribution networks, in accordance with one or more embodiments described herein.

In further embodiments, such as generally illustrated in FIG. 9, the non-limiting semiconductor device 100 can include a power gating circuit 942 to turn on and turn off the voltage generated within the semiconductor device 100 from contacting the third power supply 916. Such voltage control facilitated by the power gating circuit 942 can be utilized in power mitigation schemes for various circuits and semiconductor devices. The second power supply 914 can include a first portion 914A, a second portion 914B, and a third portion 914C that can be disposed substantially parallel to each other. The power gating circuit 942 can be coupled vertically (e.g., in the Z-direction) between the third portion 914C of the second power supply 914 and the third power supply 916.

Figure 10:
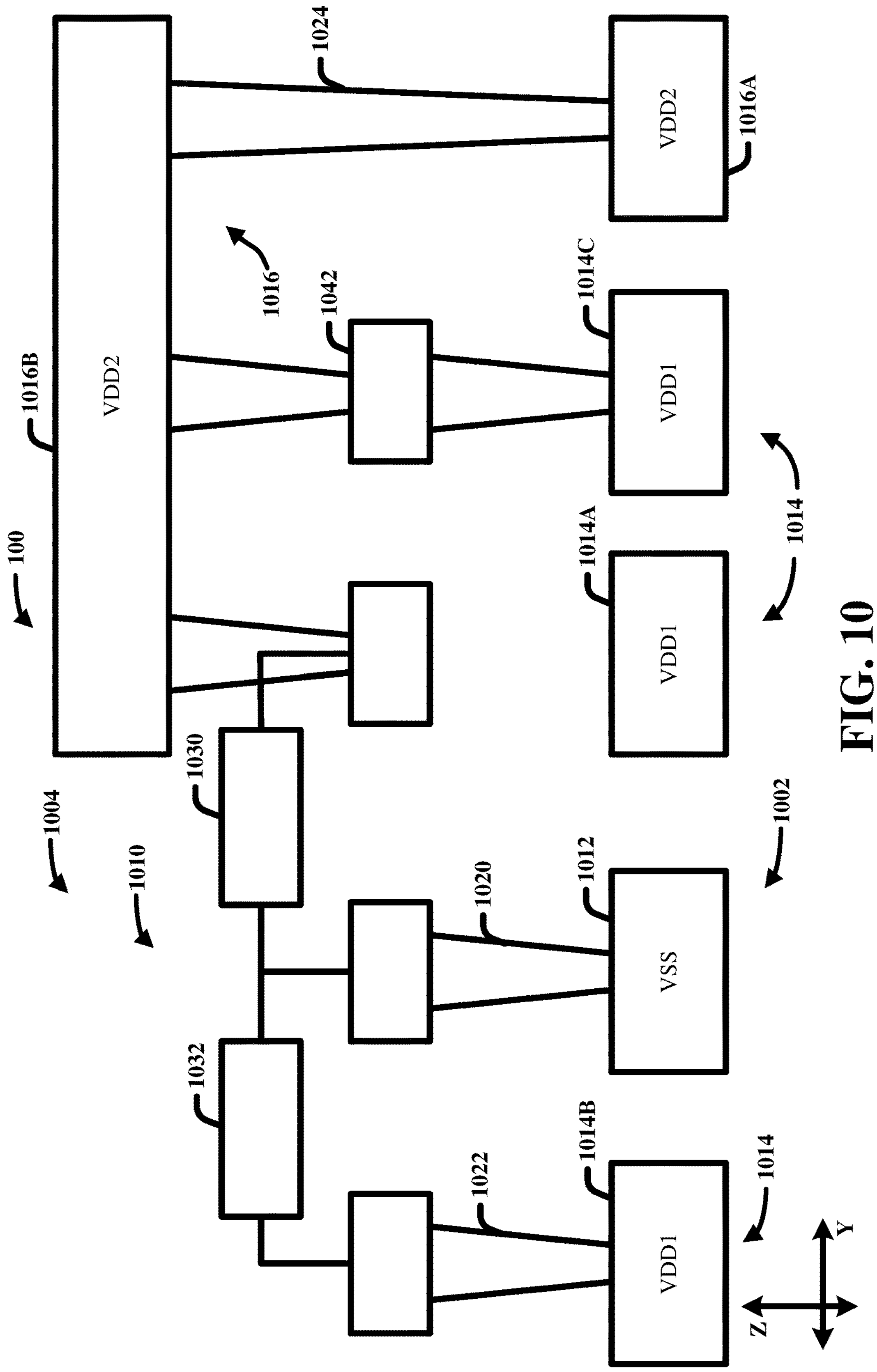
FIG. 10 illustrates a cross-sectional view of an example, non-limiting semiconductor device comprising frontside and backside power distribution networks, in accordance with one or more embodiments described herein.

With embodiments, such as illustrated in FIG. 10, the non-limiting semiconductor device 100 can include a power gating circuit 1042 to mitigate voltages from the second power supply 1014, and, additionally, a third via connection formation 1024 can connect the third power supply 1016 to the backside 1002 and the frontside 1004 of the one or more circuits 1010. The second power supply 1014 can include a first portion 1014A, a second portion 1014B, and a third portion 1014C that can be disposed on the backside 1002 of the one or more circuits 1010. The third power supply 1016 can include a first portion 1016A disposed on the backside 1002 of the one or more circuits 110, and a second portion 1016B disposed on the frontside 1004 of the one or more circuits 110. Such as can be seen from FIG. 10, the power gating circuit 1042 can be disposed horizontally adjacent to the third via connection formation 1024 (e.g., in the Y-direction). Due to power consumption considerations, the non-limiting semiconductor device 100 can utilize the above connection structure to selectively shut down and power various IP cores of the one or more circuits 1010.

Figure 11:
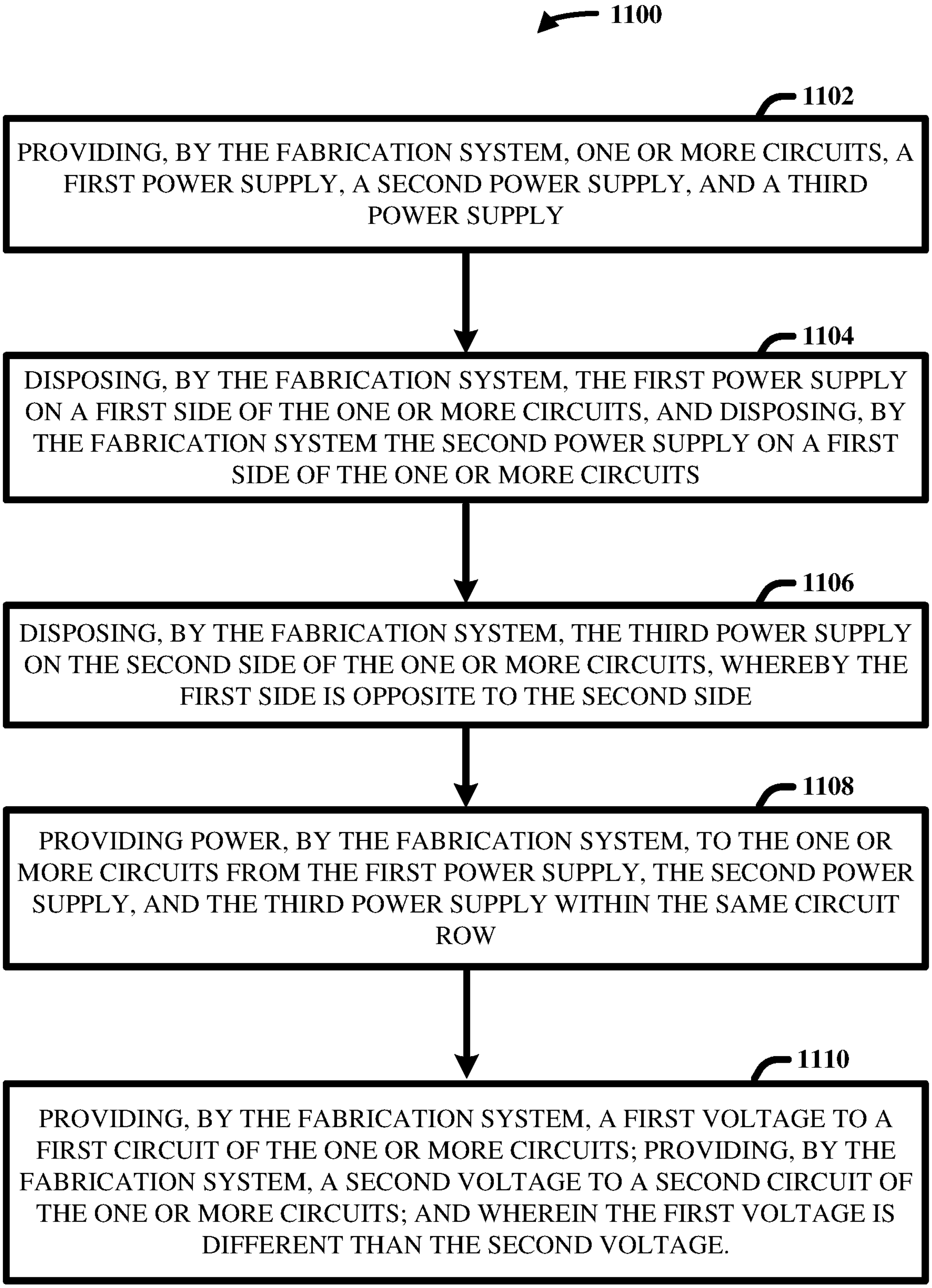
FIG. 11 illustrates a flow diagram of an example, non-limiting method for fabricating a semiconductor device with frontside and backside power distribution networks, in accordance with one or more embodiments described herein.

In embodiments, such as generally illustrated by FIG. 11, a method 1100 of fabricating the non-limiting semiconductor device 100, by a fabrication system can include providing one or more circuits 110, a first power supply 112, a second power supply 114, and a third power supply 116 (step 1102). The method 1100 of fabricating the non-limiting semiconductor device 100 can comprise disposing, by the fabrication system, the first power supply 112 on a first side 102 (e.g., the backside) of the one or more circuits 110, and disposing, by the fabrication system, a second power supply 114 on the first side 102 of the one or more circuits 110 (step 1104).

With embodiments, the method 1100 can further comprise disposing, by the fabrication system, the third power supply 116 on the second side 104 of the one or more circuits 110, where the first side 102 can be opposite the second side (step 1106). Additionally, the method 1100 can further include providing power, by the fabrication system, to the one or more circuits from the first power supply, the second power supply, and the third power supply within the same circuit row (step 1108). Further, the one or more circuits 110 can include a first circuit 130 and a second circuit 132.

The method 1100 can further comprise providing, by the fabrication system, the first circuit 130 with a first voltage, and providing, by the fabrication system, the second circuit 132 with a second voltage, where the first voltage is different than the second voltage (step 1110).

For example, one or more embodiments described herein of the non-limiting semiconductor device 100 and/or one or more components thereof can employ one or more computing resources of the computing environment 1200 described below with reference to the illustration of FIG. 12. For instance, the system and/or components thereof can employ one or more classical and/or quantum computing resources to execute one or more classical and/or quantum: mathematical functions, calculations and/or equations; computing and/or processing scripts; algorithms; models (e.g., artificial intelligence (AI) models, machine learning (ML) models and/or like model); and/or another operation in accordance with one or more embodiments described herein.

It is to be understood that although one or more embodiments described herein include a detailed description on cloud computing, implementation of the teachings recited herein are not limited to a cloud computing environment. Rather, one or more embodiments described herein are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines and services) that can be rapidly provisioned and released with minimal management effort or interaction with a provider of the service. This cloud model can include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but can be able to specify location at a higher level of abstraction (e.g., country, state or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth and active user accounts). Resource usage can be monitored, controlled and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage or individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems or storage, but has control over the deployed applications and possibly application hosting environment configurations.

Infrastructure as a Service (IaaS): the capability provided to the consumer is to provision processing, storage, networks and/or other fundamental computing resources where the consumer can deploy and run arbitrary software, which can include operating systems and applications. The consumer does not manage or control the underlying cloud infrastructure but has control over operating systems, storage, deployed applications and/or possibly limited control of select networking components (e.g., host firewalls).

A cloud computing environment is service oriented with a focus on statelessness, low coupling, modularity and/or semantic interoperability. At the heart of cloud computing is an infrastructure that includes a network of interconnected nodes.

Figure 12:
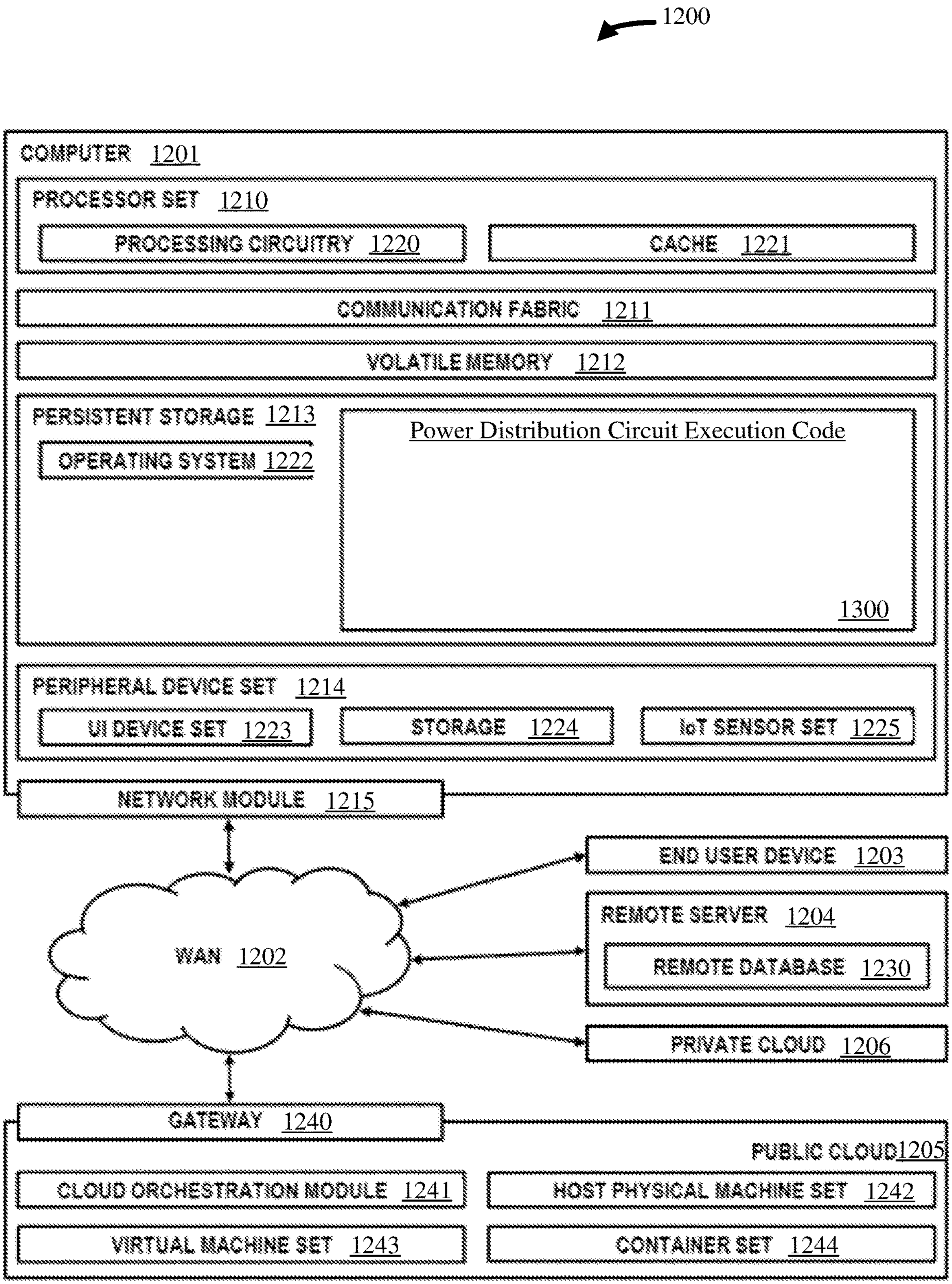
FIG. 12 illustrates a block diagram of an example, non-limiting operating environment in which one or more embodiments described herein can be facilitated.

FIG. 12 and the following discussion are intended to provide a general description of a suitable computing environment 1200 in which one or more embodiments described herein at FIGS. 1-11 can be implemented. For example, various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks can be performed in reverse order, as a single integrated step, concurrently or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium can be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include diskette, hard disk, random access memory (RAM), read-only memory (ROM), erasable programmable read-only memory (EPROM or Flash memory), static random-access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Computing environment 1200 contains an example of an environment for the execution of at least some of the computer code involved in performing the inventive methods, such as translation of an original source code based on a configuration of a target system by the power distribution circuit execution code block 1300. In addition to block 1300, computing environment 1200 includes, for example, computer 1201, wide area network (WAN) 1202, end user device (EUD) 1203, remote server 1204, public cloud 1205, and private cloud 1206. In this embodiment, computer 1201 includes processor set 1210 (including processing circuitry 1220 and cache 1221), communication fabric 1211, volatile memory 1212, persistent storage 1213 (including operating system 1222 and block 1300, as identified above), peripheral device set 1214 (including user interface (UI), device set 1223, storage 1224, and Internet of Things (IoT) sensor set 1225), and network module 1215. Remote server 1204 includes remote database 1230. Public cloud 1205 includes gateway 1240, cloud orchestration module 1241, host physical machine set 1242, virtual machine set 1243, and container set 1244.

COMPUTER 1201 can take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 1230. As is well understood in the art of computer technology, and depending upon the technology, performance of a computer-implemented method can be distributed among multiple computers and/or between multiple locations. On the other hand, in this presentation of computing environment 1200, detailed discussion is focused on a single computer, specifically computer 1201, to keep the presentation as simple as possible. Computer 1201 can be located in a cloud, even though it is not shown in a cloud in FIG. 12. On the other hand, computer 1201 is not required to be in a cloud except to any extent as can be affirmatively indicated.

PROCESSOR SET 1210 includes one, or more, computer processors of any type now known or to be developed in the future. Processing circuitry 1220 can be distributed over multiple packages, for example, multiple, coordinated integrated circuit chips. Processing circuitry 1220 can implement multiple processor threads and/or multiple processor cores. Cache 1221 is memory that is located in the processor chip package(s) and is typically used for data or code that should be available for rapid access by the threads or cores running on processor set 1210. Cache memories are typically organized into multiple levels depending upon relative proximity to the processing circuitry. Alternatively, some, or all, of the cache for the processor set can be located “off chip.” In some computing environments, processor set 1210 can be designed for working with qubits and performing quantum computing.

Computer readable program instructions are typically loaded onto computer 1201 to cause a series of operational steps to be performed by processor set 1210 of computer 1201 and thereby effect a computer-implemented method, such that the instructions thus executed will instantiate the methods specified in flowcharts and/or narrative descriptions of computer-implemented methods included in this document (collectively referred to as “the inventive methods”). These computer readable program instructions are stored in various types of computer readable storage media, such as cache 1221 and the other storage media discussed below. The program instructions, and associated data, are accessed by processor set 1210 to control and direct performance of the inventive methods. In computing environment 1200, at least some of the instructions for performing the inventive methods can be stored in block 1300 in persistent storage 1213.

COMMUNICATION FABRIC 1211 is the signal conduction path that allows the various components of computer 1201 to communicate with each other. Typically, this fabric is made of switches and electrically conductive paths, such as the switches and electrically conductive paths that make up busses, bridges, physical input/output ports and the like. Other types of signal communication paths can be used, such as fiber optic communication paths and/or wireless communication paths.

VOLATILE MEMORY 1212 is any type of volatile memory now known or to be developed in the future. Examples include dynamic type random access memory (RAM) or static type RAM. Typically, the volatile memory is characterized by random access, but this is not required unless affirmatively indicated. In computer 1201, the volatile memory 1212 is located in a single package and is internal to computer 1201, but, alternatively or additionally, the volatile memory can be distributed over multiple packages and/or located externally with respect to computer 1201.

PERSISTENT STORAGE 1213 is any form of non-volatile storage for computers that is now known or to be developed in the future. The non-volatility of this storage means that the stored data is maintained regardless of whether power is being supplied to computer 1201 and/or directly to persistent storage 1213. Persistent storage 1213 can be a read only memory (ROM), but typically at least a portion of the persistent storage allows writing of data, deletion of data and re-writing of data. Some familiar forms of persistent storage include magnetic disks and solid-state storage devices. Operating system 1222 can take several forms, such as various known proprietary operating systems or open-source Portable Operating System Interface type operating systems that employ a kernel. The code included in block 1300 typically includes at least some of the computer code involved in performing the inventive methods.

PERIPHERAL DEVICE SET 1214 includes the set of peripheral devices of computer 1201. Data communication connections between the peripheral devices and the other components of computer 1201 can be implemented in various ways, such as Bluetooth connections, Near-Field Communication (NFC) connections, connections made by cables (such as universal serial bus (USB) type cables), insertion type connections (for example, secure digital (SD) card), connections made though local area communication networks and even connections made through wide area networks such as the internet. In various embodiments, UI device set 1223 can include components such as a display screen, speaker, microphone, wearable devices (such as goggles and smart watches), keyboard, mouse, printer, touchpad, game controllers, and haptic devices. Storage 1224 is external storage, such as an external hard drive, or insertable storage, such as an SD card. Storage 1224 can be persistent and/or volatile. In some embodiments, storage 1224 can take the form of a quantum computing storage device for storing data in the form of qubits. In embodiments where computer 1201 is required to have a large amount of storage (for example, where computer 1201 locally stores and manages a large database) then this storage can be provided by peripheral storage devices designed for storing large amounts of data, such as a storage area network (SAN) that is shared by multiple, geographically distributed computers. IoT sensor set 1225 is made up of sensors that can be used in Internet of Things applications. For example, one sensor can be a thermometer and another sensor can be a motion detector.

NETWORK MODULE 1215 is the collection of computer software, hardware, and firmware that allows computer 1201 to communicate with other computers through WAN 1202. Network module 1215 can include hardware, such as modems or Wi-Fi signal transceivers, software for packetizing and/or de-packetizing data for communication network transmission, and/or web browser software for communicating data over the internet. In some embodiments, network control functions and network forwarding functions of network module 1215 are performed on the same physical hardware device. In other embodiments (for example, embodiments that utilize software-defined networking (SDN)), the control functions and the forwarding functions of network module 1215 are performed on physically separate devices, such that the control functions manage several different network hardware devices. Computer readable program instructions for performing the inventive methods can typically be downloaded to computer 1201 from an external computer or external storage device through a network adapter card or network interface included in network module 1215.

WAN 1202 is any wide area network (for example, the internet) capable of communicating computer data over non-local distances by any technology for communicating computer data, now known or to be developed in the future. In some embodiments, the WAN can be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

END USER DEVICE (EUD) 1203 is any computer system that is used and controlled by an end user (for example, a customer of an enterprise that operates computer 1201) and can take any of the forms discussed above in connection with computer 1201. EUD 1203 typically receives helpful and useful data from the operations of computer 1201. For example, in a hypothetical case where computer 1201 is designed to provide a recommendation to an end user, this recommendation would typically be communicated from network module 1215 of computer 1201 through WAN 1202 to EUD 1203. In this way, EUD 1203 can display, or otherwise present, the recommendation to an end user. In some embodiments, EUD 1203 can be a client device, such as thin client, heavy client, mainframe computer and/or desktop computer.

REMOTE SERVER 1204 is any computer system that serves at least some data and/or functionality to computer 1201. Remote server 1204 can be controlled and used by the same entity that operates computer 1201. Remote server 1204 represents the machine(s) that collect and store helpful and useful data for use by other computers, such as computer 1201. For example, in a hypothetical case where computer 1201 is designed and programmed to provide a recommendation based on historical data, then this historical data can be provided to computer 1201 from remote database 1230 of remote server 1204.

PUBLIC CLOUD 1205 is any computer system available for use by multiple entities that provides on-demand availability of computer system resources and/or other computer capabilities, especially data storage (cloud storage) and computing power, without direct active management by the scale. The direct and active management of the computing resources of public cloud 1205 is performed by the computer hardware and/or software of cloud orchestration module 1241. The computing resources provided by public cloud 1205 are typically implemented by virtual computing environments that run on various computers making up the computers of host physical machine set 1242, which is the universe of physical computers in and/or available to public cloud 1205. The virtual computing environments (VCEs) typically take the form of virtual machines from virtual machine set 1243 and/or containers from container set 1244. It is understood that these VCEs can be stored as images and can be transferred among and between the various physical machine hosts, either as images or after instantiation of the VCE. Cloud orchestration module 1241 manages the transfer and storage of images, deploys new instantiations of VCEs and manages active instantiations of VCE deployments. Gateway 1240 is the collection of computer software, hardware and firmware allowing public cloud 1205 to communicate through WAN 1202.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

PRIVATE CLOUD 1206 is similar to public cloud 1205, except that the computing resources are only available for use by a single enterprise. While private cloud 1206 is depicted as being in communication with WAN 1202, in other embodiments a private cloud can be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 1205 and private cloud 1206 are both part of a larger hybrid cloud.

The embodiments described herein can be directed to one or more of a system, a method, an apparatus and/or a computer program product at any possible technical detail level of integration. The computer program product can include a computer readable storage medium (or media) having computer readable program instructions thereon for causing a processor to carry out aspects of the one or more embodiments described herein. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a superconducting storage device and/or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon and/or any suitable combination of the foregoing. A computer readable storage medium, as used herein, is not to be construed as being transitory signals per se, such as radio waves and/or other freely propagating electromagnetic waves, electromagnetic waves propagating through a waveguide and/or other transmission media (e.g., light pulses passing through a fiber-optic cable), and/or electrical signals transmitted through a wire.

Computer readable program instructions described herein can be downloaded to respective computing/processing devices from a computer readable storage medium and/or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the one or more embodiments described herein can be assembler instructions, instruction-set-architecture (ISA) instructions, machine instructions, machine dependent instructions, microcode, firmware instructions, state-setting data, configuration data for integrated circuitry, and/or source code and/or object code written in any combination of one or more programming languages, including an object oriented programming language such as Smalltalk, C++ or the like, and/or procedural programming languages, such as the "C" programming language and/or similar programming languages. The computer readable program instructions can execute entirely on a computer, partly on a computer, as a stand-alone software package, partly on a computer and/or partly on a remote computer or entirely on the remote computer and/or server. In the latter scenario, the remote computer can be connected to a computer through any type of network, including a local area network (LAN) and/or a wide area network (WAN), and/or the connection can be made to an external computer (for example, through the Internet using an Internet Service Provider). In one or more embodiments, electronic circuitry including, for example, programmable logic circuitry, field-programmable gate arrays (FPGA) and/or programmable logic arrays (PLA) can execute the computer readable program instructions by utilizing state information of the computer readable program instructions to personalize the electronic circuitry, in order to perform aspects of the one or more embodiments described herein.

Aspects of the one or more embodiments described herein are described with reference to flowchart illustrations and/or block diagrams of methods, apparatus (systems), and computer program products according to one or more embodiments described herein. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general-purpose computer, special purpose computer and/or other programmable data processing apparatus to produce a machine, such that the instructions, which execute via the processor of the computer or other programmable data processing apparatus, can create means for implementing the functions/acts specified in the flowchart and/or block diagram block or blocks. These computer readable program instructions can also be stored in a computer readable storage medium that can direct a computer, a programmable data processing apparatus and/or other devices to function in a particular manner, such that the computer readable storage medium having instructions stored therein can comprise an article of manufacture including instructions which can implement aspects of the function/act specified in the flowchart and/or block diagram block or blocks. The computer readable program instructions can also be loaded onto a computer, other programmable data processing apparatus and/or other device to cause a series of operational acts to be performed on the computer, other programmable apparatus and/or other device to produce a computer implemented process, such that the instructions which execute on the computer, other programmable apparatus and/or other device implement the functions/acts specified in the flowchart and/or block diagram block or blocks.

The flowcharts and block diagrams in the figures illustrate the architecture, functionality and/or operation of possible implementations of systems, computer-implementable methods and/or computer program products according to one or more embodiments described herein. In this regard, each block in the flowchart or block diagrams can represent a module, segment and/or portion of instructions, which comprises one or more executable instructions for implementing the specified logical function. In one or more alternative implementations, the functions noted in the blocks can occur out of the order noted in the Figures. For example, two blocks shown in succession can be executed substantially concurrently, and/or the blocks can sometimes be executed in the reverse order, depending upon the functionality involved. It will also be noted that each block of the block diagrams and/or flowchart illustration, and/or combinations of blocks in the block diagrams and/or flowchart illustration, can be implemented by special purpose hardware-based systems that can perform the specified functions and/or acts and/or carry out one or more combinations of special purpose hardware and/or computer instructions.

While the subject matter has been described above in the general context of computer-executable instructions of a computer program product that runs on a computer and/or computers, those skilled in the art will recognize that the one or more embodiments herein also can be implemented at least partially in parallel with one or more other program modules. Generally, program modules include routines, programs, components and/or data structures that perform particular tasks and/or implement particular abstract data types. Moreover, the aforedescribed computer-implemented methods can be practiced with other computer system configurations, including single-processor and/or multiprocessor computer systems, mini-computing devices, mainframe computers, as well as computers, hand-held computing devices (e.g., PDA, phone), and/or microprocessor-based or programmable consumer and/or industrial electronics. The illustrated aspects can also be practiced in distributed computing environments in which tasks are performed by remote processing devices that are linked through a communications network. However, one or more, if not all aspects of the one or more embodiments described herein can be practiced on stand-alone computers. In a distributed computing environment, program modules can be located in both local and remote memory storage devices.

As used in this application, the terms "component," "system," "platform" and/or "interface" can refer to and/or can include a computer-related entity or an entity related to an operational machine with one or more specific functionalities. The entities described herein can be either hardware, a combination of hardware and software, software, or software in execution. For example, a component can be, but is not limited to being, a process running on a processor, a processor, an object, an executable, a thread of execution, a program and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system and/or across a network such as the Internet with other systems via the signal). As another example, a component can be an apparatus with specific functionality provided by mechanical parts operated by electric or electronic circuitry, which is operated by a software and/or firmware application executed by a processor. In such a case, the processor can be internal and/or external to the apparatus and can execute at least a part of the software and/or firmware application. As yet another example, a component can be an apparatus that provides specific functionality through electronic components without mechanical parts, where the electronic components can include a processor and/or other means to execute software and/or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter described herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit and/or device comprising, but not limited to, single-core processors; single-processors with software multithread execution capability; multi-core processors; multi-core processors with software multithread execution capability; multi-core processors with hardware multithread technology; parallel platforms; and/or parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, and/or any combination thereof designed to perform the functions described herein. Further, processors can exploit nano-scale architectures such as, but not limited to, molecular and quantum-dot based transistors, switches and/or gates, in order to optimize space usage and/or to enhance performance of related equipment. A processor can be implemented as a combination of computing processing units.

Herein, terms such as "store," "storage," "data store," data storage," "database," and substantially any other information storage component relevant to operation and functionality of a component are utilized to refer to "memory components," entities embodied in a "memory," or components comprising a memory. Memory and/or memory components described herein can be either volatile memory or nonvolatile memory or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory and/or nonvolatile random-access memory (RAM) (e.g., ferroelectric RAM (FeRAM). Volatile memory can include RAM, which can act as external cache memory, for example. By way of illustration and not limitation, RAM can be available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM) and/or Rambus dynamic RAM (RDRAM). Additionally, the described memory components of systems and/or computer-implemented methods herein are intended to include, without being limited to including, these and/or any other suitable types of memory.

What has been described above includes mere examples of systems and computer-implemented methods. It is, of course, not possible to describe every conceivable combination of components and/or computer-implemented methods for purposes of describing the one or more embodiments, but one of ordinary skill in the art can recognize that many further combinations and/or permutations of the one or more embodiments are possible. Furthermore, to the extent that the terms "includes," "has," "possesses," and the like are used in the detailed description, claims, appendices and/or drawings such terms are intended to be inclusive in a manner similar to the term "comprising" as "comprising" is interpreted when employed as a transitional word in a claim.

The descriptions of the various embodiments have been presented for purposes of illustration but are not intended to be exhaustive or limited to the embodiments described herein. Many modifications and variations will be apparent to those of ordinary skill in the art without departing from the scope and spirit of the described embodiments. The terminology used herein was chosen to best explain the principles of the embodiments, the practical application and/or technical improvement over technologies found in the marketplace, and/or to enable others of ordinary skill in the art to understand the embodiments described herein.

What is claimed is:

1. A semiconductor device comprising:

a plurality of circuits;

a first power supply disposed on a first side of a first circuit of the plurality of circuits, wherein the first side comprises a backside a power distribution network of the semiconductor device;

a second power supply disposed on the first side of the first circuit of the plurality of circuits; and a third power supply disposed on a second side of the second circuit of the plurality of circuits, wherein the second side of the second circuit of the plurality of circuits comprises the frontside of the power distribution network of the semiconductor device, and wherein the first circuit and the second circuit are each directly connected at a common point, wherein the common point is the first power supply, and wherein the second circuit connects the third power supply and the first power supply;

wherein the frontside side of the power distribution network is opposite to the backside of the power distribution network, wherein the first power supply is ground source.

2. The semiconductor device of claim 1, wherein the first circuit and a second circuit are disposed on a same circuit row; the second circuit is coupled to the first power supply and the third power supply; and the first circuit is coupled to the first power supply and the second power supply.

3. The semiconductor device of claim 2, wherein the first circuit operates on a first voltage; the second circuit operates on a second voltage; and the first voltage is different than the second voltage.

4. The semiconductor device of claim 3, wherein the first circuit and the second circuit are coupled to a common ground via the first power supply within the same circuit row, and the second circuit is disposed laterally adjacent to the first circuit.

5. The semiconductor device of claim 4, wherein the first circuit and the second circuit are electrically coupled with at least one of the second power supply or the third power supply within the same circuit row.

6. The semiconductor device of claim 5, wherein the first power supply, the second power supply, and the third power supply are parallel rails.

7. The semiconductor device of claim 6, wherein the first power supply, the second power supply, and the third power supply are continuous rails.

8. The semiconductor device of claim 6, wherein the third power supply is a plurality of parallel rail segments disposed along the second power supply.

9. The semiconductor device of claim 8, wherein the second power supply is a plurality of rail segments disposed vertically along the third power supply.

10. The semiconductor device of claim 5, wherein the first power supply, the second power supply, and the third power supply are continuous rails; and the third power supply is disposed substantially perpendicular to the first power supply and the second power supply.

11. A semiconductor device comprising:

a plurality of circuits coupled to a frontside power distribution network and a backside power distribution network; and one or more connecting vias disposed between the frontside power distribution network and the backside power distribution network that couple the frontside power distribution network with the backside power distribution network;

wherein the backside power distribution network includes a first power supply, a second power supply, and a first portion of a third power supply; the frontside power distribution network includes a second portion of the third power supply coupled to the first portion of the third power supply by at least one of the one or more connecting vias; and the plurality of circuits receive power from the first power supply, the second power supply, and the first portion of the third power supply within the same circuit row, wherein the first circuit and the second circuit are coupled to one another at a common point, wherein the common point is a connecting via directly connected to the first power supply, and wherein the second circuit connects the first portion of the third power supply and the first power supply, wherein the second power supply includes a first portion and a second portion, and the second portion of the second power supply is coupled to the third power supply via a power gate.

12. The semiconductor device of claim 11, wherein the first portion of the second power supply is coupled to the plurality of circuits.

13. The semiconductor device of claim 12, wherein the second portion of the third power supply is distributed on the frontside power distribution network and on the backside power distribution network.

14. The semiconductor device of claim 13, wherein the one or more connecting vias couple the power gate between the second power supply and the third power supply.

15. A semiconductor device comprising:

a plurality of circuits coupled to a frontside power distribution network and a backside power distribution network;

one or more connecting vias disposed between the frontside power distribution network and the backside power distribution network that couple the frontside power distribution network with the backside power distribution network;

wherein the backside power distribution network includes a first power supply and a second power supply having a first portion and a second portion; the frontside power distribution network includes a third power supply; the first portion of the second power supply is coupled to the plurality of circuits; the second portion of the second power supply provides power to the third power supply on the frontside power distribution network; and the plurality of circuits receive power from the first power supply, the second power supply, and the third power supply within the same circuit row, wherein the first circuit and the second circuit are coupled at a common point, wherein the common point is the first power supply, and wherein the second circuit connects the first portion of the third power supply and the first power supply.

16. The semiconductor device according to claim 15, further comprising a power gate coupled between the third power supply and the second portion of the second power supply.

17. The semiconductor device according to claim 15, further comprising a voltage regulator coupled between the third power supply and the second portion of the second power supply.

* * * * *